(12) United States Patent
Best et al.

(10) Patent No.: US 7,041,996 B2
(45) Date of Patent: May 9, 2006

(54) METHOD OF ALIGNING A SUBSTRATE, A COMPUTER PROGRAM, A DEVICE MANUFACTURING METHOD AND A DEVICE MANUFACTURED THEREBY

(75) Inventors: Keith Frank Best, Prunedale, CA (US); Joseph Consolini, Costa Mesa, CA (US); Alexander Friz, San Jose, CA (US); Henricus Wilhelmus Maria Van Buel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 254 days.

(21) Appl. No.: 10/659,714

(22) Filed: Sep. 11, 2003

(65) Prior Publication Data
US 2004/0124375 A1    Jul. 1, 2004

(30) Foreign Application Priority Data
Sep. 13, 2002    (EP) ................................ 02256420

(51) Int. Cl.
*G01N 21/86*    (2006.01)

(52) U.S. Cl. .................................... 250/548; 250/559.3
(58) Field of Classification Search ..................... None
See application file for complete search history.

(56) References Cited

U.S. PATENT DOCUMENTS

| | | | |
|---|---|---|---|
| 5,225,686 A | 7/1993 | Edo | |
| 5,235,408 A | 8/1993 | Matsugu et al. | |
| 5,715,037 A * | 2/1998 | Saiki et al. | .................. 355/53 |
| 5,801,816 A | 9/1998 | Shiraishi | |
| 6,376,329 B1 | 4/2002 | Sogard et al. | |

FOREIGN PATENT DOCUMENTS

| | | |
|---|---|---|
| JP | 62-58624 A | 3/1987 |
| JP | 6-132197 | 5/1994 |
| JP | 10-10746 A | 1/1998 |

OTHER PUBLICATIONS

Derwent Abstract Accession No. 98-205204/18, RD 407007 A (ANON) Mar. 10, 1998.
A copy of European Search Report dated Jul. 25, 2003.
English language translated Japanese Office Action dated Sep. 16, 2005.

* cited by examiner

*Primary Examiner*—Que T. Le
(74) *Attorney, Agent, or Firm*—Pillsbury Winthrop Shaw Pittman LLP

(57) ABSTRACT

While the alignment beam is focused on a mark on the substrate table, the substrate table is moved substantially perpendicularly to the alignment beam. If the image of the mark moves relative to a reference mark, then the substrate and the alignment beam are not perpendicular. The mark on the substrate table is aligned to a plurality of reference marks. At least two substrate marks are then aligned with a single reference mark. Errors due to the inclination of the alignment beam are eliminated from the expansion and rotation values calculated for the substrate.

23 Claims, 3 Drawing Sheets

Fig. 5

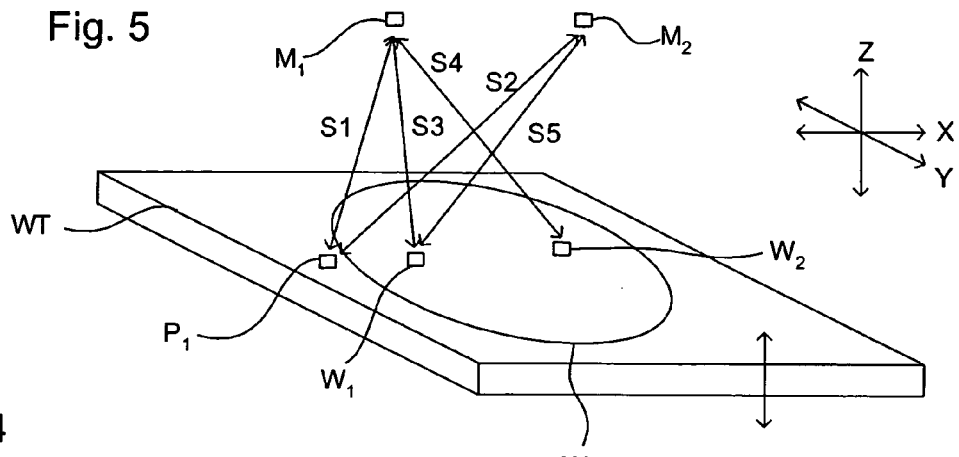

Fig. 4

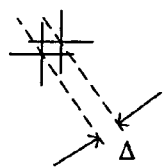

Fig. 6

S1: Align reference mark M1 and mark P1. Measure inclination of alignment beam AB relative to substrate table WT and correct so alignment beam AB is perpendicular to substrate table WT.

S2: Align reference mark $M_2$ and mark $P_1$

S3: Align reference mark $M_1$ and substrate mark $W_1$

S4: Align reference mark $M_1$ and substrate mark $W_2$

S5: Align reference mark $M_2$ and substrate mark $W_1$

METHOD OF ALIGNING A SUBSTRATE, A COMPUTER PROGRAM, A DEVICE MANUFACTURING METHOD AND A DEVICE MANUFACTURED THEREBY

RELATED APPLICATIONS

This application claims the benefit of European Patent Application EP 02256420.7, filed Sep. 13, 2002, the entire contents of which document is hereby incorporated by reference.

BACKGROUND

1. Field of the Invention

This invention relates to lithographic apparatus and methods.

2. Background Information

The term "patterning structure" as here employed should be broadly interpreted as referring to structure that may be used to endow an incoming radiation beam with a patterned cross-section, corresponding to a pattern that is to be created in a target portion of the substrate. The terms "light valve" and "spatial light modulator" may also be used in this context. Generally, such a pattern will correspond to a particular functional layer in a device being created in the target portion, such as an integrated circuit or other device (see below). Examples of such patterning structure include:

—A mask. The concept of a mask is well known in lithography, and it includes mask types such as binary, alternating phase-shift, and attenuated phase-shift, as well as various hybrid mask types. Placement of such a mask in the radiation beam may cause selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

—A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of very small (possibly microscopic) mirrors, each of which may be individually tilted about an axis by applying a suitable localized electric field, or by employing piezoelectric actuation means. The mirrors may be matrix-addressable, such that addressed mirrors will reflect an incoming radiation beam in a different direction with respect to unaddressed mirrors; in this manner, the reflected beam is patterned according to the addressing pattern of the matrix-addressable mirrors. The required matrix addressing can be performed using suitable electronic circuitry. In both of the situations described hereabove, the patterning structure can comprise one or more programmable mirror arrays. More information on mirror arrays as here referred to can be gleaned, for example, from U.S. Pat. Nos. 5,296,891 and 5,523,193, which are incorporated herein by reference, and PCT patent applications WO 98/38597 and WO 98/33096, which are incorporated herein by reference. In the case of a programmable mirror array, the support structure for the array may be embodied, for example, as a frame or table which is fixed or movable as required.

—A programmable LCD array. An example of such a construction is given in U.S. Pat. No. 5,229,872, which is incorporated herein by reference. As above, the support structure in this case may be embodied, for example, as a frame or table which is fixed or movable as required.

For purposes of simplicity, the rest of this text may, at certain locations, specifically direct itself to examples involving a mask (or "reticle") and mask table; however, the general principles discussed in such instances should be seen in the broad context of the patterning structure as hereabove set forth.

Lithographic projection apparatus may be used, for example, in the manufacture of devices such as integrated circuits (ICs). In such a case, the patterning structure may generate a circuit pattern corresponding to an individual layer of the IC, and this pattern can be imaged onto a target portion (e.g. comprising one or more dies) on a substrate (e.g. a wafer of silicon or other semiconductor material) that has been coated with a layer of radiation-sensitive material (resist). In general, a single wafer will contain a network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. A projection beam in a scanning type of apparatus may have the form of a slit (e.g. rectangular or arcuate) with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will be repeated for each new layer.

Eventually, an array of devices will be present on the substrate (wafer). The devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4.

The term "projection system" should be broadly interpreted as encompassing various types of projection system, including refractive optics, reflective optics, and catadioptric systems, for example. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices, the additional tables may be used in parallel, or preparatory steps may be carried out on one or more tables while one or more other tables are being used for exposures. Dual stage lithographic apparatus are described, for example, in U.S. Pat. No. 5,969,441 and PCT Application WO 98/40791, which documents are incorporated herein by reference.

Before exposure, it is usually desirable for the substrate and/or substrate table to be correctly aligned. A mark is therefore provided on the substrate table, and an alignment beam is projected towards the mark and partially reflected through an alignment system. The alignment beam is imaged onto a reference mark (e.g. on the mask) to detect alignment between the mark and the reference mark.

For some applications (e.g. micro-electromechanical systems or "MEMS"), a pattern is transferred to a substrate, and a further substrate layer is then adhered onto the substrate, to produce what may be called a "bonded wafer." In this situation, it may be important for the patterns of two substrate layers to be correctly aligned relative to each other, and so the same alignment marks are used for both alignments and exposures. However, the patterns of the first and second substrate layers may still be misaligned. If the alignment beam of radiation is not exactly perpendicular to the substrate, for example, the difference in height between the first and second layers may cause the alignment beam to intersect the surface of the layers at different XY positions. The patterns on the two layers therefore may not be correctly aligned. Furthermore, as the alignment marks may not be exactly in the focal plane of the alignment beam, the alignment may be further compromised.

SUMMARY

A method of aligning a substrate according to one embodiment of the invention includes providing an alignment beam. An inclination of the alignment beam relative to a substrate table holding the substrate is detected, where the substrate table has a mark. The alignment beam is adjusted to be perpendicular to the substrate table. Using the alignment beam, a first reference mark is aligned with the mark of the substrate table, and a second reference mark is aligned with the mark of the substrate table. Using the alignment beam, the first reference mark is aligned with a first mark of the substrate and with a second mark of the substrate.

Detecting an inclination of the alignment beam relative to said substrate table may include detecting a first position of the mark of the substrate table relative to the alignment beam, moving the substrate table in a direction perpendicular to the top of the table, and detecting a second position of the mark of the substrate table relative to the alignment beam. A difference between the first and second relative positions indicates an inclination of the alignment beam relative to said substrate table.

A device manufacturing method according to a further embodiment of the invention may include projecting a patterned beam of radiation onto a target portion of a layer of radiation-sensitive material on the substrate, where the substrate is aligned using a method as described herein.

A computer program according to a further embodiment of the invention includes instructions that, when executed on a computer system (e.g. a system including a microprocessor or other programmable array of logic elements), instruct a lithographic projection apparatus to carry out the steps of an alignment method or a device manufacturing method as described herein. Other embodiments of the invention include a machine-readable storage medium (e.g. a volatile or nonvolatile semiconductor memory device such as SRAM, DRAM, or flash RAM; or an optical, magnetic, or phase-change medium such as a CD-ROM or other disk) having such instructions.

A lithographic projection apparatus according to a further embodiment of the invention includes a substrate table that can be moved in a direction substantially parallel to an alignment beam.

Although specific reference may be made in this text to the use of the apparatus according to the invention in the manufacture of ICs, it should be explicitly understood that such an apparatus may have many other possible applications. For example, it may be employed in the manufacture of devices such as integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

In the present document, the terms "radiation" and "beam" are used to encompass all types of electromagnetic radiation, including ultraviolet radiation (e.g. with a wavelength of 365, 248, 193, 157 or 126 mm) and EUV (extreme ultra-violet radiation, e.g. having a wavelength in the range 5–20 μm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 4 shows the alignment offset resulting from the set up of FIG. 2;

FIG. 5 shows the movement of a substrate table according to an embodiment of the invention;

FIG. 6 shows the acts involved in a method of aligning a substrate with a set of reference marks according to one embodiment of the invention.

In the Figures, corresponding reference symbols indicate corresponding parts.

DETAILED DESCRIPTION

Embodiments of the present invention include methods of aligning a substrate with reference marks. At least some of these methods may be suitable for use with a composite substrate.

Figure 1:
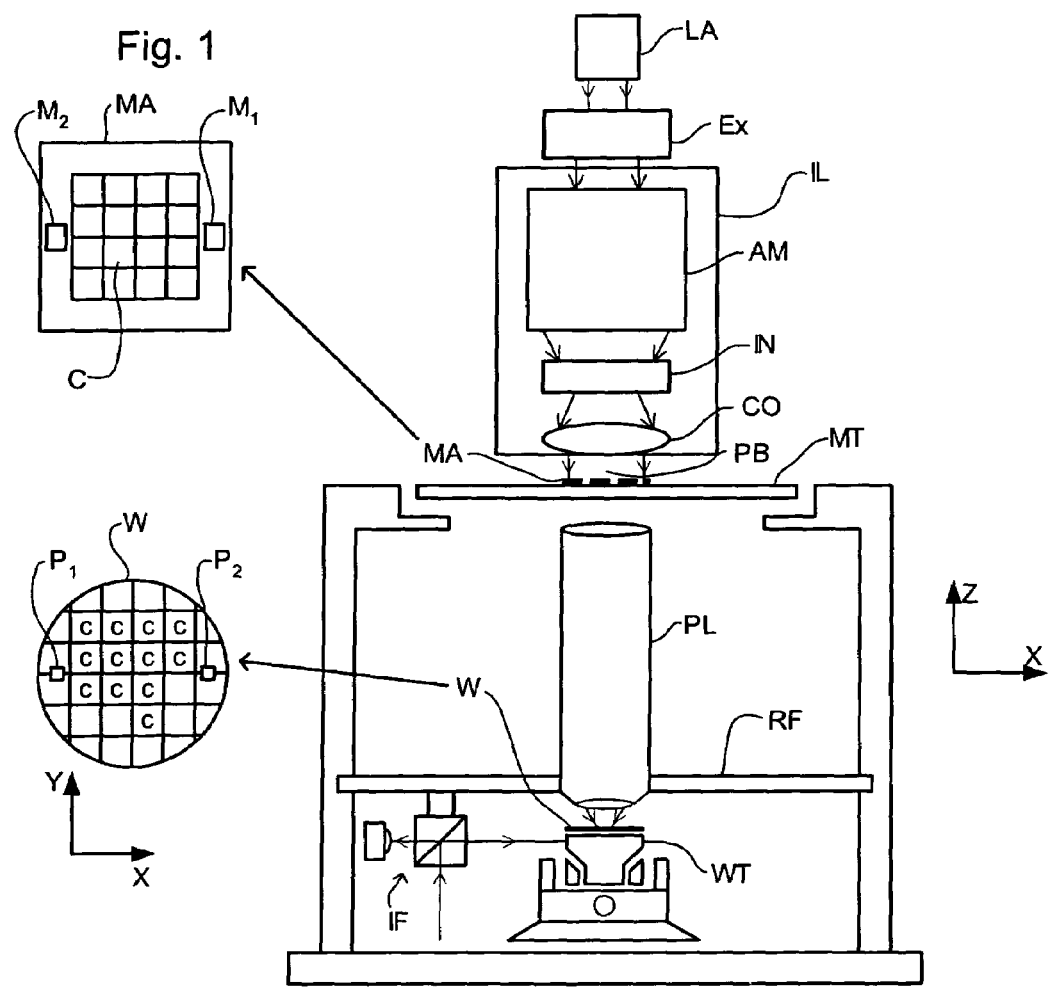
FIG. 1 depicts a lithographic projection apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam PB of radiation. In this particular example, the radiation system Ex, IL for supplying a projection beam PB of radiation (e.g. EUV radiation) also comprises a radiation source LA;

A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WT is provided with a substrate holder for holding a substrate W (e.g. a resist-coated silicon wafer), and is connected to a second positioning structure for accurately positioning the substrate with respect to item PL; and A projection system ("lens") configured to project the patterned beam. In this example, projection system PL (e.g. a catadioptric lens system) is configured to image an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. having a reflective mask). Alternatively, the apparatus may employ another type of patterning structure, such as a programmable mirror array of a type as referenced above.

The source LA (e.g. a laser-produced or discharge plasma source, or an undulator provided around the path of an electron beam in a storage ring or synchrotron) produces a beam of radiation. The beam is fed into an illumination system (illuminator) IL, either directly or after having traversed conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning structure (and interferometric measuring means IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB.

2. In scan mode, essentially the same scenario applies, except that a given target portion C is not exposed in a single "flash." Instead, the mask table MT is movable in a given direction (the so-called "scan direction," e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
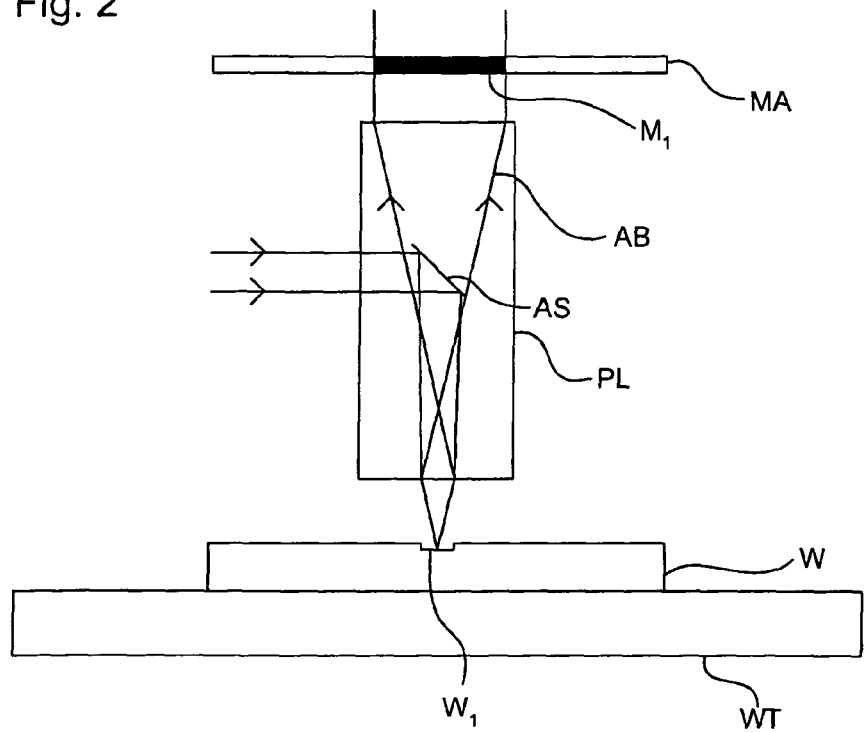
FIG. 2 is a diagram showing the alignment mechanics.

Prior to exposure of the substrate by such an apparatus, alignment of the mask MA and the substrate W takes place. In one typical arrangement, a complementary reference mark $M_1$ and a mark $W_1$ are present on the mask MA and substrate W, respectively. As shown in FIG. 2, an alignment beam AB is projected through the projection system PL and partially reflected from the mark $W_1$ through the alignment system AS. The alignment beam is then imaged onto the reference mark $M_1$. The alignment of the mark $W_1$ and reference mark $M_1$ can be detected to determine the alignment of the substrate W.

Figure 3:
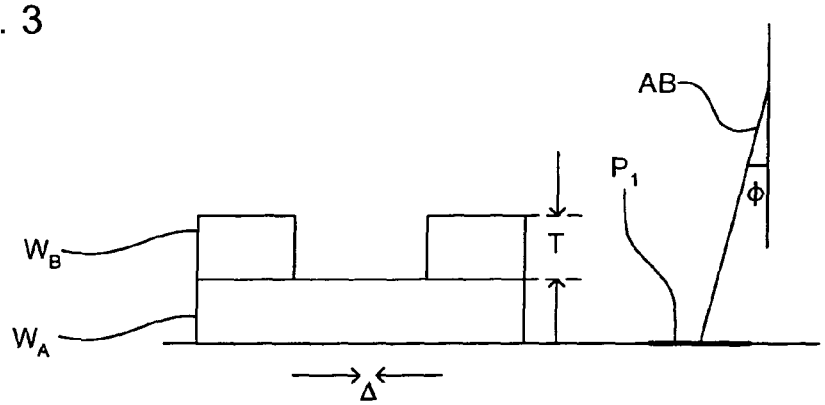
FIG. 3 shows an alignment beam not perpendicular to the substrate.

The substrate may have a plurality of layers. For example, a substrate mark on a first layer of such a substrate may be visible through a corresponding window in a second layer. FIG. 3 shows a substrate that includes a first substrate layer $W_A$ and a second substrate layer $W_B$ of thickness T bonded to the top of first substrate layer $W_A$. Mark $P_1$ (sometimes called a fiducial) is situated on the substrate table WT adjacent to substrate W. As shown in this figure, the alignment beam AB is not perpendicular to the top surface of the substrate W (beam AB being inclined by an angle φ from the surface normal of substrate W). If projection of the alignment beam AB onto the second substrate layer $W_B$ takes place with the alignment beam AB at this angle to the substrate W, the measured position of the second substrate layer $W_B$ will differ from the real position of the second substrate layer $W_B$ (with respect to first layer $W_A$) by an offset $\Delta$, given by the equation:

$$\Delta = \phi \times T$$

(this equation is an approximation that assumes small $\phi$). The offset $\Delta$ is shown schematically in FIG. 4. If printing on the second substrate layer $W_B$ occurs on the basis of such measurement, it will be offset from printing on the first substrate layer $W_A$ by the amount $\Delta$.

To detect this offset, the substrate table WT is able to move vertically, as shown in FIG. 5. To detect a misalignment (e.g. inclination) of the alignment beam AB, the alignment beam is initially focused on mark $P_1$ and reflected towards reference mark $M_1$ in step S1. The substrate table WT is moved to establish correct XY orientation. The position of the image of mark $P_1$ relative to reference mark $M_1$ is scanned, and the substrate table WT is then moved upwards in the Z direction by up to 100 μm. The position of the image of mark $P_1$ relative to reference mark $M_1$ is scanned again, and the results are compared to those of the first scan. If the image of mark $P_1$ has moved relative to reference mark $M_1$, then the alignment beam AB and the substrate table WT are not perpendicular. The inclination of the alignment beam AB is therefore altered to correct this misalignment. The same procedure may be repeated in order to check alignment again. Aligning the mark on the substrate table to the two reference marks may thus be performed to ascertain the relative position of the reference marks and the substrate table.

In step S2, the apparatus is adjusted (e.g. by moving the mark $M_2$) so the alignment beam AB focuses on mark $P_1$ but is reflected towards a second reference mark $M_2$. This measurement establishes the displacement of reference mark $M_2$ relative to $M_1$.

In step S3, the apparatus is adjusted again (e.g. by returning mark $M_1$ to its initial position and moving the substrate W) so the alignment beam AB focuses on substrate mark $W_1$ situated on the first substrate layer $W_A$ of substrate W and is reflected towards reference mark $M_1$. As the alignment beam is perpendicular to the surface of the substrate W, this measurement may be used to establish the relative positions of reference mark $M_1$ and substrate mark $W_1$ (and thus the absolute position of the substrate W).

To determine the expansion (e.g. scaling) and rotation of substrate W, the apparatus is adjusted in step S4 (e.g. by moving the substrate W) such that alignment beam AB is projected towards a second substrate mark $W_2$, also situated on the first substrate layer, and reflected towards first reference mark $M_1$. As the positions of $W_1$ and $W_2$ have both been measured with respect to the same reference mark $M_1$, any slight error (due to, for example, the substrate marks being slightly out of focus) will be the same for both measurements, and the expansion and rotation values calculated will therefore be unaffected.

Aligning more than one substrate mark to a single reference mark may be performed to ascertain the rotation and expansion of the substrate (relative to the reference mark as known e.g. from earlier measurements). As the position of the two substrate marks is measured relative to a single reference mark, there are no relative errors in the rotation and expansion values obtained. The substrate can be accurately aligned even if the substrate marks are not exactly in the focal plane of the alignment beam.

To obtain an improved calculation of the absolute position of the substrate W, substrate mark $W_1$ may optionally be aligned with reference mark $M_2$ in step S5. The apparatus is adjusted (e.g. by moving the substrate W and/or the reference mark $M_2$) so the alignment beam is projected towards substrate mark $W_1$ and reflected towards reference mark $M_2$. This step provides a more accurate alignment of the substrate to the reference marks as the substrate is aligned to two different reference marks, and it can be repeated for other reference marks, if there are any more.

Steps S3 and S4 can be repeated as necessary for further substrate marks. Step S5 can also be repeated for $W_2$ and further substrate marks. Similarly, step S2 can be repeated for any additional marks on the substrate table WT. One or more such additional steps may be performed to provide an improved accuracy of alignment.

The step of aligning the substrate marks to a reference mark can be repeated for further substrate marks, thereby calculating the rotation and expansion more accurately, possibly including some rotation and/or expansion elements which are difficult to calculate using values from just two substrate marks. By using such a method, patterns on second and subsequent substrate layers can be aligned relative to a preceding layer with an accuracy better than 250 nm. This therefore allows bonded wafers with layers with a thickness up to 500 μm bonded to the preceding layer to be accurately aligned. Such an alignment process can be repeated for third and subsequent substrate layers, e.g. to a total thickness of 2 mm.

In at least some applications, an alignment procedure as described herein may be executed before any printing is done on any substrate layer. Alternatively, an alignment procedure as described herein may be executed before any printing is done on at least the topmost substrate layer.

If the alignment beam is not exactly perpendicular to the substrate table, a "vertical" (perpendicular to the surface of the substrate table) movement of the substrate table may generate a lateral movement of the mark with respect to the alignment beam. Ensuring that the alignment beam is perpendicular to the surface of the substrate may be performed to alleviate this problem.

An aligning task as described herein may include projecting said alignment beam towards a table mark ("fiducial") or a substrate mark such that the beam is deflected through a reference mark. The reference marks are preferably provided on a mask used to project a pattern onto the substrate, but may also be located in another reference location.

As described herein, the alignment beam is adjusted to be perpendicular to the substrate. For example, the inclination of the alignment beam relative to the substrate may be detected initially, with the alignment beam being consequently adjusted. The adjustment of the alignment beam to be perpendicular to the substrate may take place just prior to exposure taking place (i.e. after aligning the alignment beam to be perpendicular to the substrate table). Alternatively, such adjustment may take place just prior to aligning the reference marks with the substrate marks.

Figure 7:
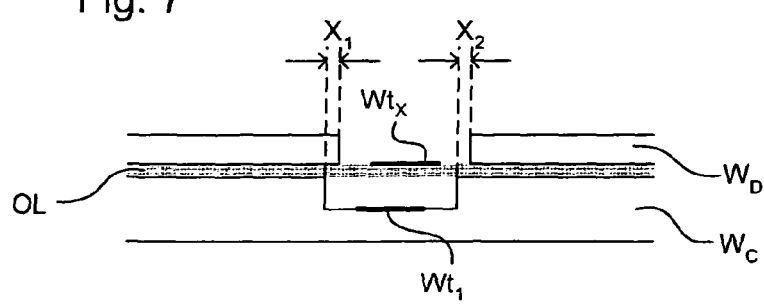
FIG. 7 shows a schematic cross section of a composite wafer used to assess the accuracy of a method according to an embodiment of the invention.

To assess the accuracy of such a method of detecting inclination, a scanning electron microscope was used. A method as described above was used to ensure that a substrate layer $W_C$ (as shown in FIG. 7) and the alignment beam were perpendicular. A second substrate layer WD was adhered to the first substrate layer. The reference mark $M_1$, together with the perpendicular alignment beam, were used to estimate the location of the test mark $Wt_1$. At the estimated location of $Wt_1$, $Wt_x$ the second substrate layer was etched to the oxide layer, OL. A cross section of these alignment marks was then scanned using a SEM. The misalignment of the estimated location of test mark $Wt_1$, relative to the actual location of $Wt_1$ in the direction X, is given by the equation:

$$X_T = \frac{(\Delta X_1 + \Delta X_2)}{2}$$

The cross section of the alignment marks must be scanned in at least two perpendicular directions in order to fully calculate the misalignment. Using this assessment technique, a procedure according to an embodiment of the invention was shown to result in an overlay between original and estimated mark of <250 nm over distances of up to 100 μm.

Whilst specific embodiments of the invention have been described above, it will be appreciated that the invention as claimed may be practiced otherwise than as described. It is explicitly noted that the description of these embodiments is not intended to limit the invention as claimed.

What is claimed is:

1. A method of aligning a substrate having first and second substrate marks to a plurality of reference marks, said method comprising:
   providing an alignment beam;
   detecting an inclination of said alignment beam relative to a substrate table holding the substrate, said substrate table having a mark;
   adjusting said alignment beam to be perpendicular to said substrate table;
   aligning a first said reference mark with said mark of said substrate table using said alignment beam; and
   aligning said first reference mark with said first substrate mark using said alignment beam.

2. The method of aligning a substrate according to claim 1, further comprising aligning said first reference mark with said second substrate mark using said alignment beam.

3. The method of aligning a substrate according to claim 1, wherein said detecting an inclination of said alignment beam relative to said substrate table comprises:
   detecting a first position of said mark on said substrate table relative to said alignment beam;
   moving said substrate table in a direction perpendicular to a top surface of said substrate table; and
   detecting a second position of said mark on said substrate table relative to said alignment beam,
   wherein a difference between said first and second relative positions indicates an inclination of the alignment beam relative to said substrate table.

4. The method of aligning a substrate according to claim 1, further comprising aligning a second said reference mark with said mark of said substrate table using said alignment beam.

5. The method of aligning a substrate according to claim 4, further comprising aligning said second reference mark with said first substrate mark using said alignment beam.

6. The method of aligning a substrate according to claim 1, wherein said using said alignment beam comprises projecting said alignment beam towards one of a substrate mark and the mark on said substrate table such that the beam is deflected through a reference mark.

7. The method of aligning a substrate according to claim 1, further comprising providing a mask on which said reference marks are arranged.

8. The method of aligning a substrate according to claim 1, wherein said substrate has a plurality of layers, the substrate marks being on a first layer visible through windows in a second layer.

9. The method of aligning a substrate according to claim 1, wherein said alignment beam is adjusted to be perpendicular to said substrate.

10. A device manufacturing method comprising:
    providing a substrate that is at least partially covered by a layer of radiation-sensitive material and that has first and second substrate marks;
    providing a projection beam of radiation using a radiation system;
    using patterning structure to endow the projection beam with a pattern in its cross-section;
    projecting the patterned beam of radiation onto a target portion of the layer of radiation-sensitive material;
    providing an alignment beam;
    detecting an inclination of said alignment beam relative to a substrate table holding the substrate, said substrate table having a mark;
    adjusting said alignment beam to be perpendicular to said substrate table;
    aligning a first reference mark with said mark of said substrate table using said alignment beam; and
    aligning said first reference mark with said first substrate mark using said alignment beam.

11. The device manufacturing method according to claim 10, wherein said detecting an inclination of said alignment beam relative to said substrate table comprises:
    detecting a first position of said mark on said substrate table relative to said alignment beam;
    moving said substrate table in a direction perpendicular to a top surface of said substrate table; and
    detecting a second position of said mark on said substrate table relative to said alignment beam,
    wherein a difference between said first and second relative positions indicates an inclination of the alignment beam relative to said substrate table.

12. The method of aligning a substrate according to claim 10, further comprising aligning a second reference mark with said mark of said substrate table using said alignment beam.

13. The device manufacturing method according to claim 12, further comprising aligning said second reference mark with said first substrate mark using said alignment beam.

14. The device manufacturing method according to claim 10, wherein said using said alignment beam comprises projecting said alignment beam towards one of a substrate mark and the mark on said substrate table such that the beam is deflected through a reference mark.

15. The device manufacturing method according to claim 10, further comprising providing a mask on which said reference marks are arranged.

16. The device manufacturing method according to claim 10, wherein said substrate has a plurality of layers, the substrate marks being on a first layer visible through windows in a second layer.

17. A device manufactured according to the method of claim 10.

18. A computer program comprising a plurality of instructions that, when executed on a computer system, instructs an apparatus to perform the device manufacturing method according to claim 10.

19. A computer program comprising a plurality of instructions that, when executed on a computer system, instructs an apparatus to perform the method of aligning a substrate according to claim 1.

20. The computer program according to claim 19, wherein said detecting an inclination of said alignment beam relative to said substrate table comprises:
   detecting a first position of said mark on said substrate table relative to said alignment beam;
   moving said substrate table in a direction perpendicular to a top surface of said substrate table; and
   detecting a second position of said mark on said substrate table relative to said alignment beam,
   wherein a difference between said first and second relative positions indicates an inclination of the alignment beam relative to said substrate table.

21. The computer program according to claim 19, wherein said method further comprises aligning a second reference mark with said first substrate mark using said alignment beam.

22. The computer program according to claim 19, wherein said using said alignment beam comprises projecting said alignment beam towards one of a substrate mark and the mark on said substrate table such that the beam is deflected through a reference mark.

23. A method of aligning a substrate, said method comprising:
   providing an alignment beam;
   detecting a first position, relative to said alignment beam, of a mark on a substrate table holding the substrate;
   moving said substrate table in a direction perpendicular to a top surface of said substrate table;
   detecting a second position, relative to said alignment beam, of said mark on said substrate table;
   calculating an inclination of the alignment beam relative to said substrate table based on a difference between said first and second relative positions;
   based on said inclination, adjusting said alignment beam to be perpendicular to said substrate table; and
   subsequent to said adjusting, aligning a reference mark with a mark of the substrate using said alignment beam.

\* \* \* \* \*